(12) United States Patent
Dariavach et al.

(10) Patent No.: US 10,645,844 B2
(45) Date of Patent: May 5, 2020

(54) ELECTRONICS COOLING MODULE

(71) Applicant: GE AVIATION SYSTEMS, LLC, Grand Rapids, MI (US)

(72) Inventors: Nader Dariavach, Lake Worth, FL (US); Michel Engelhardt, Woodbury, NY (US); Liqiang Yang, Pompano Beach, FL (US)

(73) Assignee: GE Aviation Systems LLC, Grand Rapids, MI (US)

( * ) Notice: Subject to any disclaimer, the term of this patent is extended or adjusted under 35 U.S.C. 154(b) by 0 days.

(21) Appl. No.: 15/955,299

(22) Filed: Apr. 17, 2018

(65) Prior Publication Data
US 2019/0320556 A1 Oct. 17, 2019

(51) Int. Cl.
*H05K 7/20* (2006.01)

(52) U.S. Cl.
CPC ..... *H05K 7/20272* (2013.01); *H05K 7/20254* (2013.01); *H05K 7/20263* (2013.01); *H05K 7/20927* (2013.01)

(58) Field of Classification Search
CPC ........... H05K 7/20254; H05K 7/20263; H05K 7/20272; H05K 7/20927
See application file for complete search history.

(56) References Cited

U.S. PATENT DOCUMENTS

| 7,131,286 | B2 | 11/2006 | Miner |
| 7,340,904 | B2 | 3/2008 | Williams |
| 7,697,291 | B2 | 4/2010 | Van Kessel |
| 8,017,872 | B2 | 9/2011 | McCoy |
| 8,174,830 | B2 | 5/2012 | Yao |
| 8,522,570 | B2 | 9/2013 | Ouyang |
| 9,693,480 | B2 | 6/2017 | Salat et al. |
| 2005/0099775 | A1 | 5/2005 | Distefano |
| 2005/0145371 | A1 | 7/2005 | DiStefano et al. |
| 2008/0173427 | A1 | 7/2008 | Schumacher |
| 2009/0038780 | A1* | 2/2009 | Liu ............... F28F 1/16 165/104.28 |
| 2009/0038781 | A1 | 2/2009 | Hertweck |
| 2014/0352928 | A1 | 12/2014 | Huang et al. |
| 2015/0075749 | A1* | 3/2015 | Monfray ....... H01L 23/473 165/96 |

(Continued)

FOREIGN PATENT DOCUMENTS

CN 204259336 U 4/2015

OTHER PUBLICATIONS

Leo Casey, Bogdan Borowy, Gregg Davis, High Power Silicon Carbide Inverter Design—100kW Grid Connect Building Blocks. Stan Atcitty of Sandia National Laboratories , 40 pages, 2005. Accessed Mar. 30, 3018, at http://www.sandia.gov/ess/docs/pr_conferences/2005/Casey.pdf.

(Continued)

*Primary Examiner* — Mukundbhai G Patel
*Assistant Examiner* — Zhengfu J Feng
(74) *Attorney, Agent, or Firm* — McGarry Bair, P.C.

(57) ABSTRACT

A liquid cooling module for cooling an electronic component includes a housing supporting the electronic component, where the housing includes a cavity containing a cooling liquid. A liquid flow channel can be in fluid communication with the cavity and define a liquid cooling loop. A cold plate supporting the housing can have a cooling channel thermally coupled to the liquid flow channel.

20 Claims, 5 Drawing Sheets

(56) References Cited

U.S. PATENT DOCUMENTS

| | | |
|---|---|---|
| 2015/0351216 A1 | 12/2015 | Loewen |
| 2017/0027081 A1 | 1/2017 | Zhang et al. |
| 2017/0127564 A1* | 5/2017 | So .................. H05K 7/20136 |
| 2017/0150653 A1* | 5/2017 | Matteson ........... H05K 7/20772 |

OTHER PUBLICATIONS

Eldre, Ferraz Shswmut, R-Theta, Mersen. Cooling of Power Electronics, 5 pages, 2017. Accessed Mar. 30, 3018, at http://ep-us.mersen.com/fileadmin/catalog/Literature/Brochures/BR-Cooling-of-Power-Electronics-Brochure.pdf.

Lee Cadwallader, Reliability and Maintainability Data for Liquid Metal Cooling Systems, 26th Symposium on Fusion Engineering, 5 pages, May 2015, Idaho Falls, Idaho, USA.

Extended European Search Report issued in related EP Patent Application No. 19169118.7, 11 pages, dated Aug. 2, 2018, The Hague, Munich, Germany.

\* cited by examiner

ELECTRONICS COOLING MODULE

BACKGROUND

Contemporary electronic power conversion systems, including those utilized in aircraft and ground vehicles to provide either AC, DC or a combination of AC and DC power to avionics and other equipment to control aircraft or ground vehicles systems. The electronic systems can also include electronic components carried by a circuit board. The circuit boards can be stored in an electronic chassis, which performs several beneficial functions including protecting avionics from lightning strikes, dissipating the heat generated by electronic components, and protecting the avionics from environmental exposure.

Electronic components can produce high heat loads, and it can be beneficial to utilize cooling devices for managing and protecting the electronics during ground standby and in operation.

BRIEF DESCRIPTION

In one aspect, the disclosure relates to a liquid cooling module for cooling an electronic component. The liquid cooling module includes a housing supporting the electronic component, where the housing includes a cavity containing a cooling liquid and also includes a liquid flow channel in fluid communication with the cavity. The liquid flow channel can define a cooling loop. The liquid cooling module can also include a cold plate supporting the housing and having a cooling channel in thermal communication with liquid flow channel, and a housing impeller positioned in the cavity for circulating the cooling liquid through the liquid cooling loop.

In another aspect, the disclosure relates to a method of cooling a heat generating electronic component. The method includes driving rotation of a housing impeller to flow a first coolant through a flow path in a housing supporting the electronic component, transferring heat from the electronic component to the first coolant, and transferring heat from the first coolant to a second coolant.

DETAILED DESCRIPTION

Figure 1:
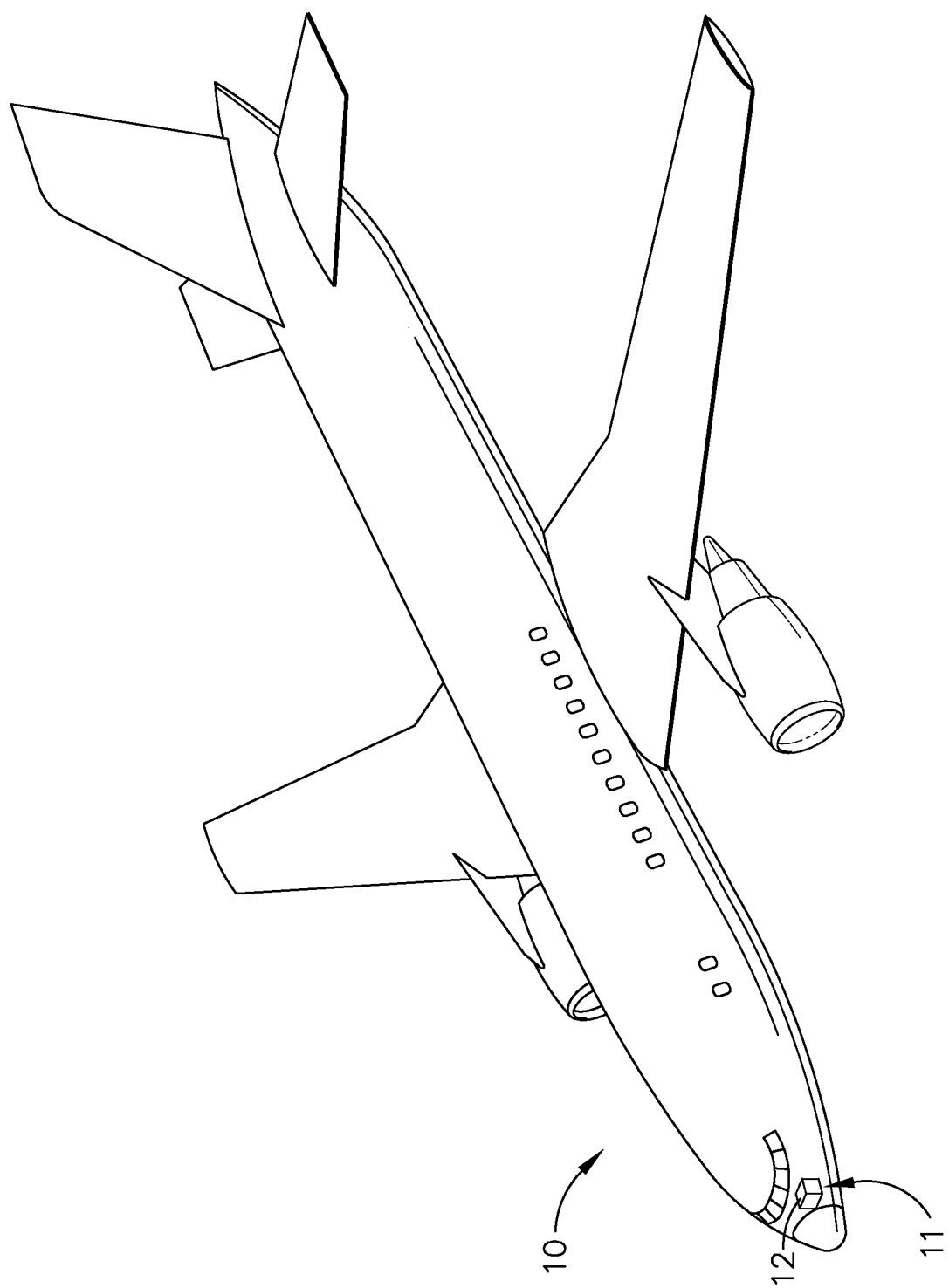
FIG. 1 is a perspective view of an aircraft having an electronics chassis in accordance with various aspects described herein.

Aspects of the present disclosure describe an approach to form and utilize a liquid cooling module for a power supply or power conversion system. For the purposes of illustration, the cooling module of the present disclosure will be described with respect to an aircraft system. It will be understood that the present disclosure is not so limited and can have general applicability in non-aircraft applications, including solar power distribution systems, as well as in other mobile or non-mobile applications, including other air-based (helicopters, unmanned airborne vehicle), land-based (i.e., power plants, ground vehicles), or marine-based applications. Aspects of the present disclosure can also be applied to or an electronic assembly such as a ceramic pack.

While this cooling module can have general applicability, the environment of an aircraft and specific application of an avionics chassis and electrical assembly will be described in further detail. Aspects of the liquid cooling module described herein can allow for increased heat dissipation when compared to traditional cooling modules or methods. Aircraft avionics have increasing demands and higher power density in a smaller space has seen an increasing requirement of power dissipating devices. New power generation units, conversion units, or transistors can have requirements for new materials and more efficient electrical and thermal management. By improving cooling performance, the liquid cooling module described herein can lend itself to an increased avionics power density which allows for increased computational power, or increased sensor or emitter power, supported within the physically-constrained space, weight-constrained space, or volume-constrained space.

While "a set of" various elements will be described, it will be understood that "a set" can include any number of the respective elements, including only one element. Additionally, all directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. The exemplary drawings are for purposes of illustration only and the dimensions, positions, order and relative sizes reflected in the drawings attached hereto can vary.

FIG. 1 schematically illustrates an aircraft 10 with a thermal management system 11, illustrated as an on-board electronics chassis 12 (shown in phantom) for housing electronics, avionics or avionic components for use in the operation of the aircraft 10. It will be understood that the thermal management system 11 can also include heat spreaders, heat sinks, heat exchanger, radiators, phase change material, graphite straps, or heat pipes in non-limiting examples. The electronics chassis 12 can house a variety of electronics and avionics elements and protects them against contaminants, electromagnetic interference (EMI), radio frequency interference (RFI), shock, vibrations, temperature extremes and the like. Alternatively or additionally, the electronics chassis 12 can have a variety of avionics mounted thereon. It will be understood that the electronics chassis 12 can be located anywhere within the aircraft 10, not just the nose as illustrated.

While illustrated in a commercial airliner, the electronics chassis 12 can be used in any type of aircraft, for example, without limitation, fixed-wing, rotating-wing, rocket, commercial aircraft, personal aircraft, or unmanned aircraft. Furthermore, aspects of the disclosure are not limited only to aircraft aspects, and can be included in other mobile and stationary configurations. Non-limiting example mobile configurations can include ground-based, water-based, or additional air-based vehicles.

Figure 2:
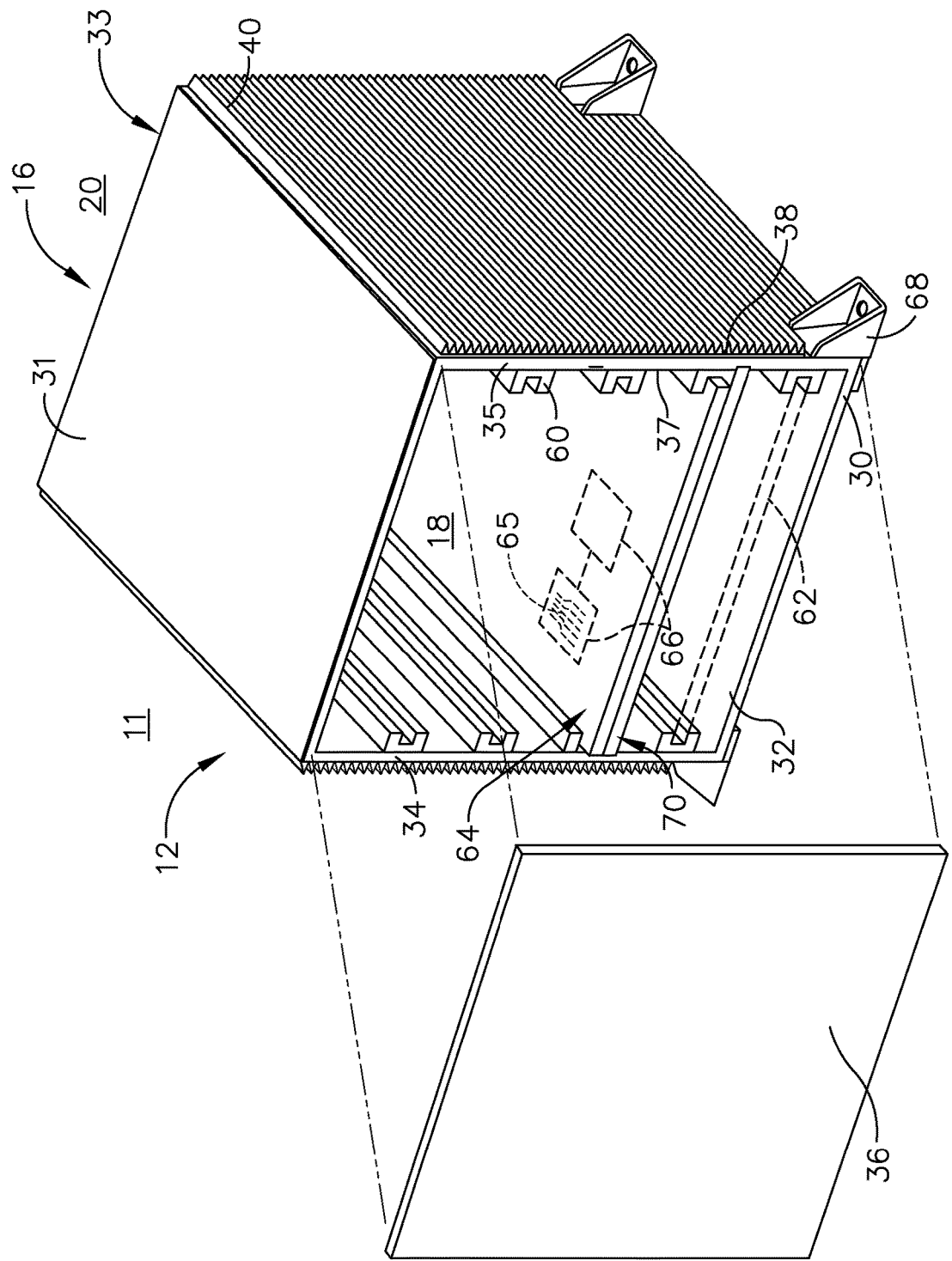
FIG. 2 is a perspective view of the exemplary electronics chassis of FIG. 1 including a cooling module in accordance with various aspects described herein.

FIG. 2 illustrates the electronics chassis 12 in further detail, where the electronics chassis 12 can include a chassis housing 16 defining an interior 18 and exterior 20. The electronics chassis 12 can include a chassis frame 30 having a top cover 31, a bottom wall 32, a back wall 33, and opposing sidewalls 34, 35. The chassis frame 30 can further include a removable front cover 36, providing access to the interior 18 of the electronics chassis 12 when removed, and at least partially restricting access to the interior 18 when coupled or mounted to the chassis frame 30. In addition, the sidewalls 34, 35 can include an interior surface 37 and an exterior surface 38. The frame can be formed from any suitable material, such as metals (aluminum or steel) and non-metals in non-limiting examples.

Further still, a set of fins 40 can project from the exterior surface 38 of the sidewalls 34, 35. The set of fins 40 can also be formed of any suitable material including aluminum, copper, steel, or metals with internal liquid or phase change materials. While the set of fins 40 are shown on the sidewalls 34, 35, the set of fins 40 can be disposed on any exterior portion of the electronics chassis 12, such as the top cover 31 or the bottom wall 32 in additional non-limiting examples. While the set of fins 40 are shown extending fully along the sidewalls 34, 35, it should be appreciated that the set of fins 40 need not extend the full length of the sidewalls 34, 35, and can be organized in other configurations.

The electronics chassis 12 can further include a set of card rails 60 within the interior 18 and supported by the interior surface 37 of the sidewalls 34, 35. The set of card rails 60 can be horizontally (or vertically) aligned on the interior surfaces 37 and spaced on opposing sidewalls 34, 35 to define effective card slots 62 (illustrated by the phantom lines). An avionics system 63 including at least one avionics system card 64 can be housed within the electronics chassis 12 by way of the card slots 62, wherein each card slot 62 can be configured to receive at least a portion of an avionics system card 64.

Each avionics system card 64 can include a set of wires 65, e.g. a wire harness or wire connectors. The set of wires can be formed of any suitable material, including copper or aluminum. Furthermore, at least one heat-producing electronic component 66 can be included on the avionics system card 64. It should be understood that the set of wires 65 can be used within the electronic component 66, or to connect multiple electronic components 66, or anywhere else within or on the avionics system card 64 as desired. In addition, while only one avionics system card 64 is shown, the electronics chassis 12 can be configured to house, support, or include any number of avionics system cards 64. In one non-limiting example, the avionics system card 64 can include a ceramic substrate with dies (e.g. electronic components 66) attached to the substrate.

The avionics system 63 can further include a liquid cooling module 70, illustrated as being provided within the electronics chassis 12 and thermally coupled to the avionics system card 64 such that heat can move away from the electronic component 66 and out of the chassis 12 through the set of fins 40. By way of non-limiting example, it is contemplated that air can be provided along the set of fins 40 to move the heat away. It is further contemplated that heat introduced to the exterior 20 of the electronics chassis 12 can dissipate by convection as well.

A set of mounting feet 68 can extend from the chassis housing 16 to facilitate mounting the electronics chassis 12 to the aircraft 10 by means of bolts, wedge locks, and screws or other suitable fasteners. Further, the set of mounting feet 68 can also function as an electrical ground to ground the electronics chassis 12 to the frame of the aircraft 10. While the set of mounting feet 68 are shown in this example, the electronics chassis 12 can be used with any desired type of attachment mechanism.

Figure 3:
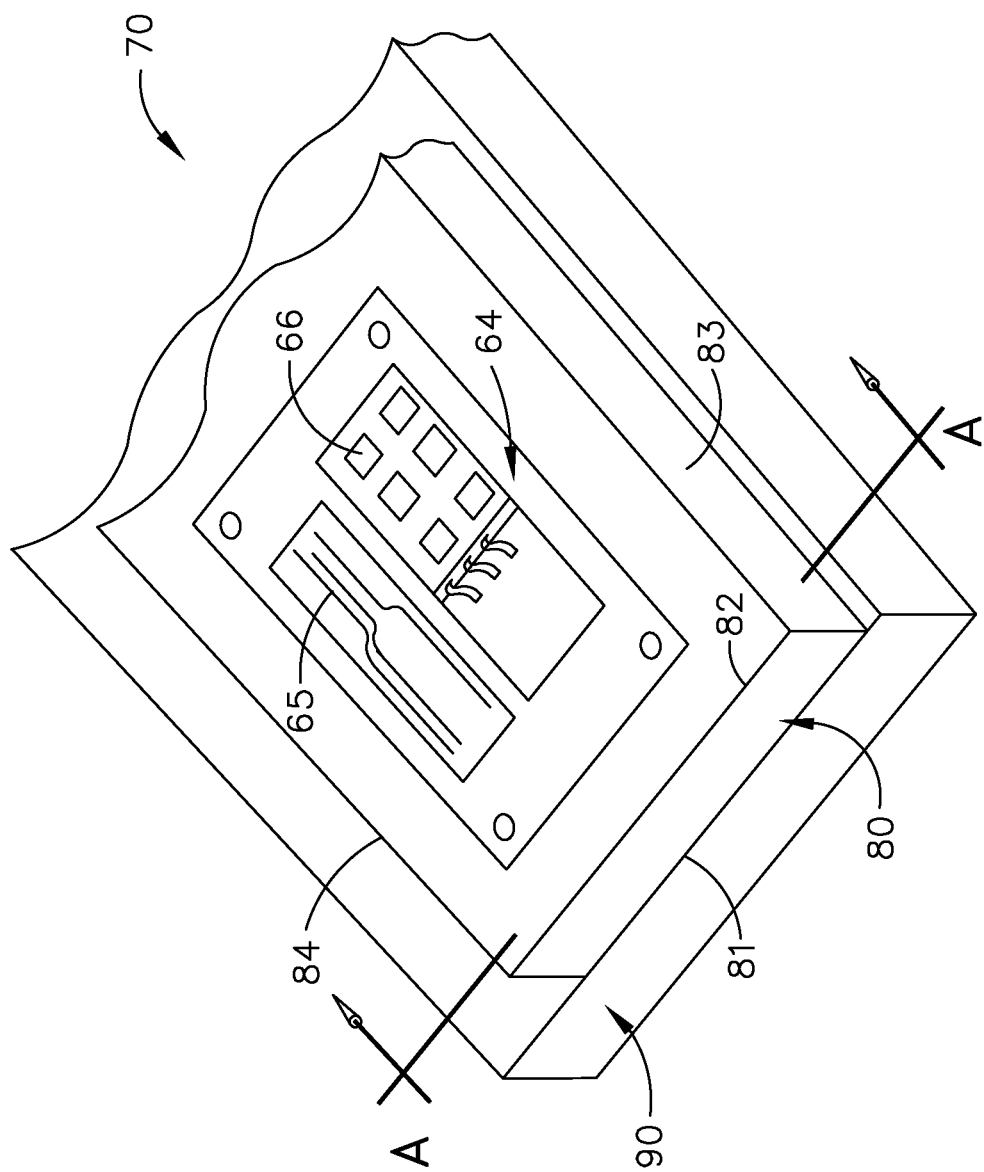
FIG. 3 is a schematic view of the cooling module of FIG. 2.

Referring now to FIG. 3, the liquid cooling module 70 is illustrated in further detail. The avionics system card 64 is illustrated including the set of wires 65 and the exemplary heat-producing electronic component 66. The electronic component 66 in one example can be a transistor, illustrated as a silicone-carbide, metal-oxide-semiconductor field-effect transistor (SiC MOSFET). It will be understood that any desired electronic component 66 can be cooled by the cooling module 70. The liquid cooling module 70 can include a housing 80 supporting the electronic component 66, such as by way of fasteners. The housing 80 can include opposing first and second surfaces 81, 82, where the first surface 81 is adjacent the electronic component 66. The housing 80 can also include opposing third and fourth surfaces 83, 84 connecting the first and second surfaces 81, 82. The liquid cooling module 70 can further include a cold plate 90 supporting the housing 80, such as by way of fasteners.

Figure 4:
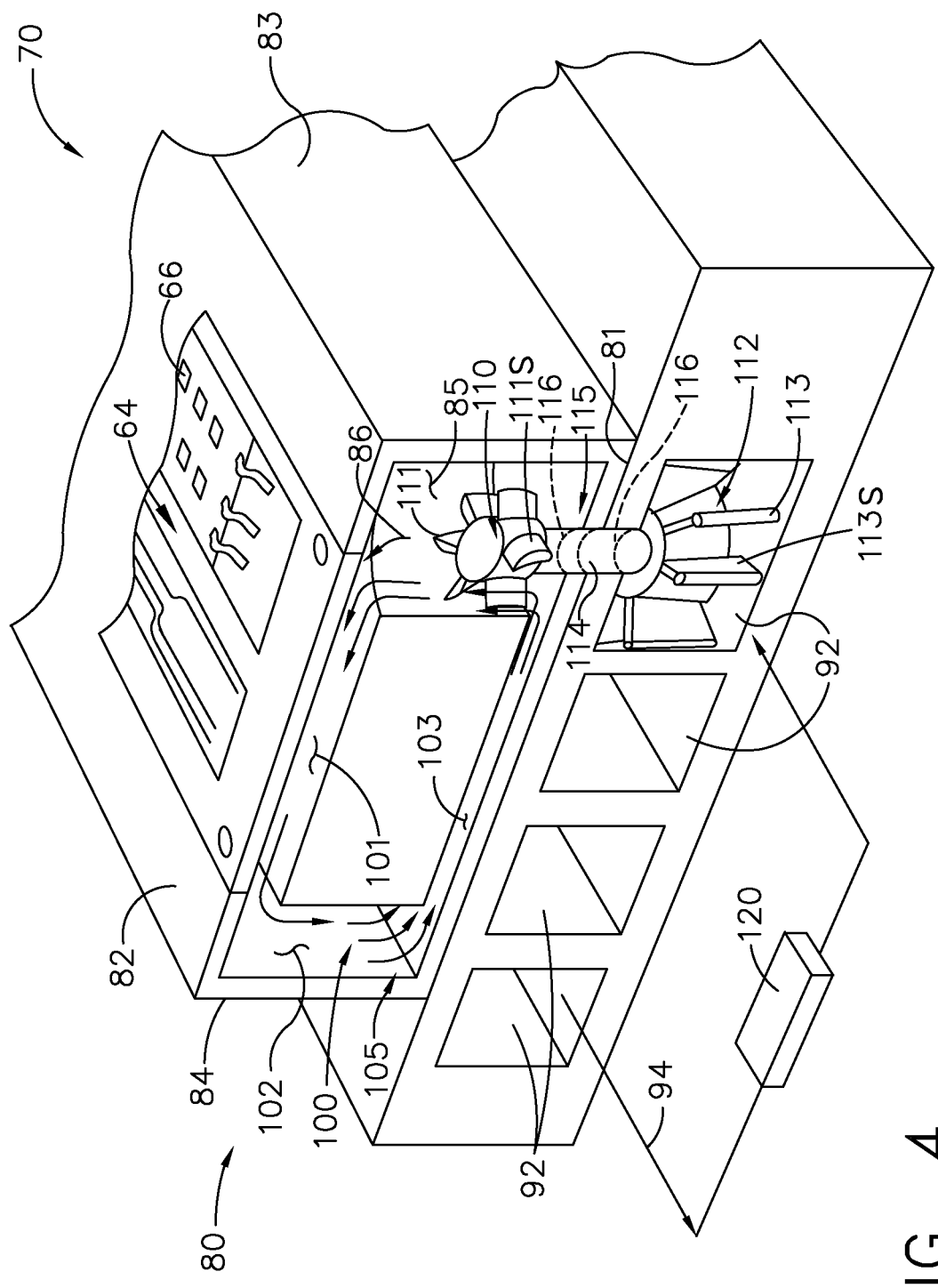
FIG. 4 is a cross-sectional view of the cooling module of FIG. 3 along the line A-A illustrating liquid cooling flow.

FIG. 4 illustrates a cross-section of liquid cooling module 70 of FIG. 3 across the line A-A. As illustrated, the housing 80 can further include a cavity 85 proximate the third surface 83 and containing a cooling liquid 86 represented by arrows. It is contemplated in one non-limiting example that a liquid metal such as gallium, gallium alloy such as galinstan, or a Na—K alloy can be used as the cooling liquid 86. Other liquid metals can also be used, as well as other cooling liquids suitable for the environment of the liquid cooling module 70. In addition, it is further contemplated that the system card 64 can be at least partially embedded within the housing 80 such that the cooling liquid 86 can directly contact the system card 64. In another example, the system card 64 can be coupled to the housing 80 with no direct contact with the cooling liquid 86.

In addition, a liquid flow channel 100 having first, second, and third portions 101, 102, 103 can be fluidly coupled to the cavity 85 and extend within the housing proximate the respective first, fourth, and second surfaces 81, 84, 82 as shown. The cavity 85 and liquid flow channel 100 can define a cooling loop 105 within the housing 80, and it is also contemplated that the cooling loop 105 can be a closed loop within the housing 80. In this manner the liquid flow channel 100 can be thermally coupled to the electronic component 66, where a portion of the liquid flow channel 100 runs proximate the cold plate 90.

The cold plate 90 can include at least one cooling channel 92 through which a coolant 94 represented by arrows can flow, such as water, ethylene glycol, propylene glycol, fuel-based coolant, or oil-based coolant, in non-limiting examples. Other structures (not illustrated) such as internal heat transfer fins can also be included within the cooling channel 92. Multiple cooling channels 92 are shown in FIG. 4, each fluidly connected to each other to form a cooling channel circuit in the cold plate 90. The at least one cooling channel 92 can be thermally coupled to the liquid flow channel 100, including by way of conductive contact between the cold plate 90 and housing 80. A pump 120 can be configured to pump coolant 94 through the cold plate 90, such as through the at least one cooling channel 92. In one example, the pump 120 can be positioned externally of the cold plate 90 and fluidly coupled to the at least one cooling channel 92 via appropriate conduits (not shown). In another example, the pump 120 can be positioned within the cold plate 90. It is further contemplated that the pump 120 can be configured to pump coolant 94 through the cold plate 90 cooling channels 92 at any desired rate, including with a continuous flow a variable flow rate as desired.

It is contemplated that a double impeller 115 can be positioned between the housing 80 and the cold plate 90. More specifically, a housing impeller 110 with a plurality of spaced vanes 111 extending radially from a shaft 114 can be located or positioned within the cavity 85 of the housing 80. The vanes 111 can circulate the cooling liquid 86 through the cooling loop 105. As illustrated, the vanes 111 have a convex front surface 111S for pushing the cooling liquid 86 through the cavity 85 when activated. In addition, a channel impeller 112 having a plurality of spaced vanes 113 extending radially from a shaft 114 can be located or positioned within the cooling channel 92 of the cold plate 90. As illustrated, the vanes 113 have a substantially perpendicular front surface 113S for being pushed by the coolant 94 flowing through the cooling channel 92. It should be recognized that vanes 111, 113 could be of many shapes and sizes. The shape of the vanes 113 can be optimized to be pushed by the coolant 94 and the shape of the vanes 111 can be optimized to push the cooling liquid 86 in the cavity 85. In this manner, the housing impeller 110, shaft 114, and channel impeller 112 can at least partially define the double impeller 115.

The shaft 114 can connect the housing impeller 110 to the channel impeller 112. For example, apertures 116 can be formed in the housing 80 and cold plate 90 through which the shaft 114 can extend to connect the housing impeller 110 and channel impeller 112. It is further contemplated that the apertures 116 can be fluidly sealed around the shaft 114 so as to preserve a closed cooling loop 105 and prevent leakages between the housing 80 and cold plate 90. While showing the impellers 110, 112 connected via the shaft 114, it should be recognized that each impeller 110, 112 could be driven by separate and independent shafts or by separate and independent driving forces, such as a pump or other driving mechanism.

In operation, the pump 120 can circulate coolant 94 through the cold plate 90, including through the at least one cooling channel 92. The channel impeller 112 can be hydraulically powered by the coolant 94, e.g. rotated by the flow of coolant 94 through the cooling channel 92. As such, the channel impeller 112 can drive the housing impeller 110 via the shaft 114. In one non-limiting example, the housing impeller 110 can rotate simultaneously with the channel impeller 112, e.g. both impellers 110, 112 having equal rotational speeds. It should be understood that other components (not shown) can be included in the liquid cooling module 70 to provide for differing rotational speeds of the impellers 110, 112 as desired.

Figure 5:
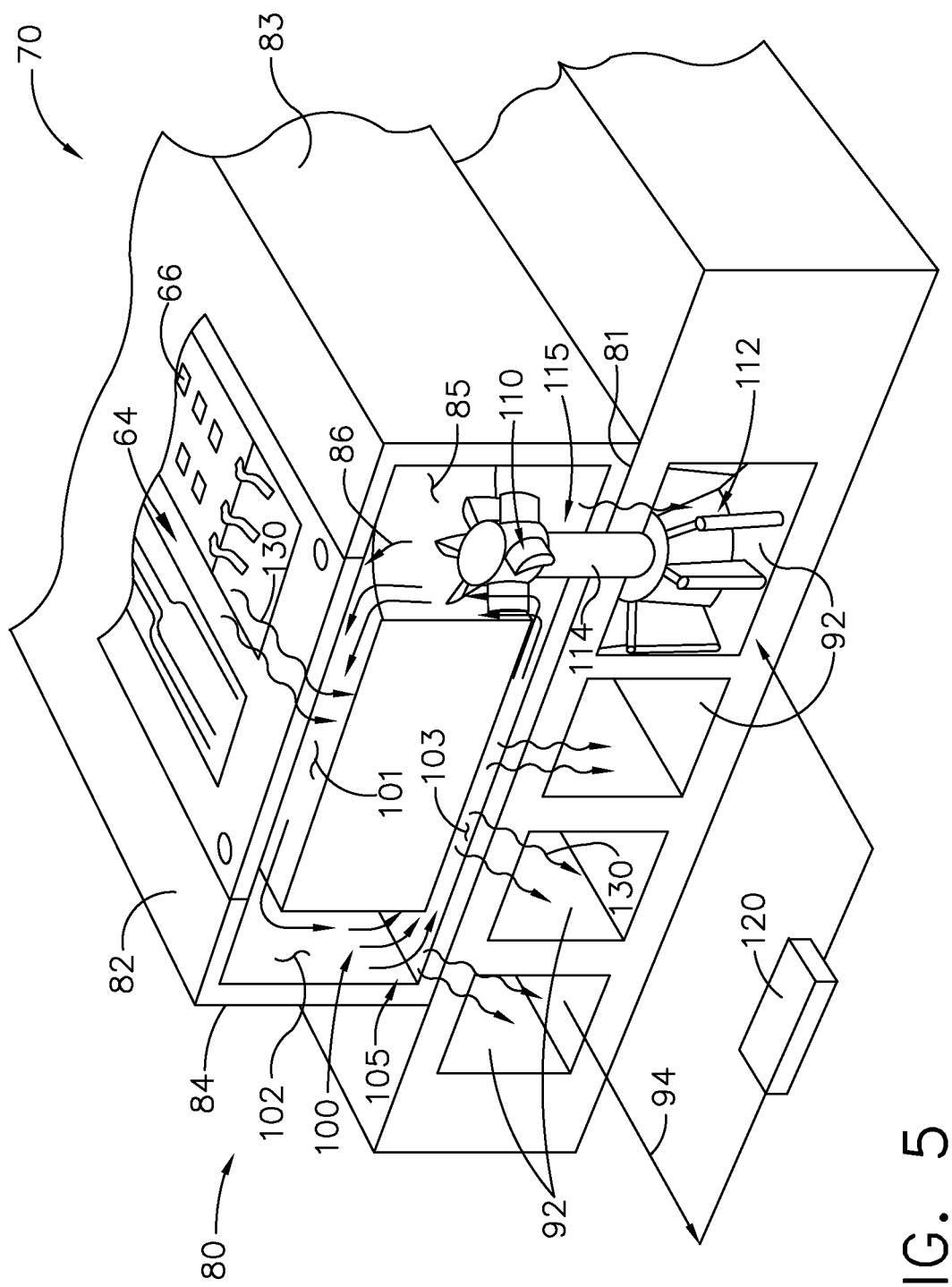
FIG. 5 illustrates heat flows within the cooling module of FIG. 3.

FIG. 5 schematically illustrates heat flows during operation of the liquid cooling module 70. The electronic component 66 e.g. the SiC MOSFET can generate heat (illustrated with arrows 130) that can transfer, such as by conduction, to the cooling liquid 86 such as liquid metal circulating in the liquid flow channel 100. As the cooling liquid 86 flows along the third portion 103, heat can conductively transfer (illustrated by arrows 140) from the cooling liquid 86 to the coolant 94 flowing through the cold plate 90.

A method of cooling a heat generating electronic component, such as the electronic component 66, includes driving rotation of the housing impeller 110 to flow a first coolant such as the cooling liquid 86 through a flow path in the housing 80 such as the liquid flow channel 100. The method further includes transferring heat from the electronic component to the cooling liquid 86, and transferring heat from the cooling liquid 86 to the coolant 94 as illustrated in FIG. 5. Optionally, the method can further include providing a cooling plate, such as the cold plate 90, for containing the coolant 94. Optionally, the method can further include positioning the channel impeller 112 within the cold plate 90. Optionally, the flow path such as the liquid flow channel 100 in the housing 80 can be a closed flow path.

Aspects of the present disclosure provide for a variety of benefits. Traditional methods of cooling SiC MOSFETs include the use of miniature, complex-geometry channels in the housing through which the coolant can flow through. Such methods generally result in high fluid pressure drops, which can be difficult for a flow circulating pump to provide. It can be appreciated that the simplified design of the liquid cooling channel in the housing, as well as providing a closed loop for the liquid metal to circulate through, can allow for reduced manufacturing costs, improved ease of operation, and increased cooling performance.

In addition, the use of liquid metal flow in place of traditional cooling liquids within the housing provides for an increased heat transfer coefficient, thereby producing a more effective heat transfer mechanism to drive heat away from the electronic component, which allows for a higher power density than in traditional electronic components such as those found in avionics. It can therefore be appreciated that the liquid cooling module as described herein can increase both component reliability and cooling performance, as well as reduce the overall weight and volume of the thermal management system.

Many other possible configurations in addition to those shown in the above figures are contemplated by the present disclosure. To the extent not already described, the different features and structures of the various aspects can be used in combination with others as desired. That one feature cannot be illustrated in all of the aspects is not meant to be construed that it cannot be, but is done for brevity of description. Thus, the various features of the different aspects can be mixed and matched as desired to form new aspects, whether or not the new aspects are expressly described. Combinations or permutations of features described herein are covered by this disclosure.

This written description uses examples to disclose aspects of the invention, including the best mode, and also to enable any person skilled in the art to practice aspects of the invention, including making and using any devices or systems and performing any incorporated methods. The patentable scope of the invention is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A liquid cooling module for cooling a silicon carbide electronic component, comprising:
   a housing supporting the silicon carbide electronic component, the housing having a cavity containing a liquid metal within a liquid flow channel thermally coupled to the silicon carbide electronic component, with the liquid flow channel defining a closed cooling loop;
   a cold plate supporting the housing and having a cooling channel containing a liquid coolant and thermally coupled to the liquid flow channel via the housing;

a pump configured to pump the liquid coolant through the cooling channel;

a channel impeller located in the cooling channel of the cold plate for circulating the liquid coolant through the cooling channel;

a housing impeller positioned in the cavity for circulating the liquid metal through the cooling loop; and a shaft extending through the housing and cold plate and coupling the housing impeller to the channel impeller such that rotation of the channel impeller drives rotation of the housing impeller.

2. The liquid cooling module of claim 1 wherein a portion of the liquid flow channel runs proximate the cold plate.

3. The liquid cooling module of claim 1 wherein the liquid coolant comprises one of water, ethylene glycol, propylene glycol, fuel-based coolant, or oil-based coolant.

4. The liquid cooling module of claim 1 wherein the housing impeller and the channel impeller rotate simultaneously.

5. The liquid cooling module of claim 1 wherein the channel impeller is hydraulically powered by the liquid coolant within the cooling channel.

6. The liquid cooling module of claim 1 wherein the liquid metal comprises one of gallium, gallium alloy, or sodium-potassium alloy.

7. A method of cooling a heat generating silicon carbide electronic component, the method comprising:

driving rotation of a housing impeller to flow a liquid metal coolant through a closed-loop liquid flow channel within a cavity in a housing supporting, and thermally coupled to, the silicon carbide electronic component;

driving rotation of a channel impeller via a pump to flow a second coolant through a cooling channel thermally coupled to the liquid flowchannel and located in a cold plate supporting the housing, with a shaft extending through the housing and cold plate and coupling the housing impeller to the channel impeller such that rotation of the channel impeller drives rotation of the housing impeller;

transferring heat from the silicon carbide electronic component to the first liquid metal coolant; and transferring heat from the liquid metal coolant to the second coolant.

8. The method of claim 7 further comprising connecting the housing impeller to a channel impeller via a shaft.

9. The method of claim 8 wherein the transferring heat from the liquid metal coolant to the second coolant further comprises transferring heat via conduction from the housing impeller to the channel impeller via the shaft.

10. The method of claim 7 wherein the driving rotation of the housing impeller further comprises flowing the liquid metal coolant proximate the cold plate.

11. The method of claim 7 wherein the driving rotation of the channel impeller further comprises driving the second coolant through the cooling channel via a pump.

12. The method of claim 7 wherein the transferring heat from the liquid metal coolant to the second coolant further comprises transferring heat via conduction from the housing to the cold plate.

13. The method of claim 7 wherein the second coolant comprises one of water, ethylene glycol, propylene glycol, fuel-based coolant, or oil-based coolant.

14. The method of claim 7 wherein the liquid metal comprises one of gallium, gallium alloy, or sodium-potassium alloy.

15. An electronics chassis for an aircraft, comprising:

a chassis housing defining an interior;

an avionics system located within the interior and having at least one electronic component; and a liquid cooling module, comprising:

a housing supporting the at least one electronic component, the housing having a cavity containing a liquid metal within a liquid flow channel thermally coupled to the at least one electronic component, with the liquid flow channel defining a closed cooling loop;

a cold plate supporting the housing and having a cooling channel containing a liquid coolant and thermally coupled to the liquid flow channel via the housing;

a pump configured to pump the liquid coolant through the cooling channel;

a channel impeller located in the cooling channel of the cold plate for circulating the liquid coolant through the cooling channel;

a housing impeller positioned in the cavity for circulating the liquid metal through the cooling loop; and a shaft extending through the housing and cold plate and coupling the housing impeller to the channel impeller such that rotation of the channel impeller drives rotation of the housing impeller.

16. The electronics chassis of claim 15 wherein the at least one electronic component comprises a silicon carbide electronic component.

17. The electronics chassis of claim 15 wherein the liquid coolant comprises one of water, ethylene glycol, propylene glycol, fuel-based coolant, or oil-based coolant.

18. The electronics chassis of claim 15 further comprising at least one slot configured to mount to the at least one electronic component.

19. The electronics chassis of claim 15 further comprising a set of fins projecting from an exterior surface of the chassis housing and thermally coupled to the interior.

20. The electronics chassis of claim 15 wherein the liquid metal comprises one of gallium, gallium alloy, or sodium-potassium alloy.

* * * * *